(12) United States Patent
Lin et al.

(10) Patent No.: US 7,042,032 B2
(45) Date of Patent: May 9, 2006

(54) MAGNETORESISTIVE (MR) MAGNETIC DATA STORAGE DEVICE WITH SIDEWALL SPACER LAYER ISOLATION

(75) Inventors: Wen-Chin Lin, Hsin-Chu (TW); Denny Duan-Lee Tang, Saratoga, CA (US); Chao-Hsiung Wang, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 202 days.

(21) Appl. No.: 10/401,945

(22) Filed: Mar. 27, 2003

(65) Prior Publication Data
US 2004/0188730 A1 Sep. 30, 2004

(51) Int. Cl.
*H01L 29/76* (2006.01)
(52) U.S. Cl. ............... 257/295; 257/295; 257/296
(58) Field of Classification Search ........ 257/295, 257/296, 30, 306, 421; 365/171, 173; 438/3
See application file for complete search history.

(56) References Cited

U.S. PATENT DOCUMENTS

| | | | |
|---|---|---|---|
| 5,959,880 A | 9/1999 | Shi et al. | |
| 6,351,410 B1 * | 2/2002 | Nakao et al. | 365/171 |
| 6,358,756 B1 | 3/2002 | Sandhu et al. | |
| 6,392,922 B1 * | 5/2002 | Liu et al. | 365/158 |
| 6,413,788 B1 | 7/2002 | Tuttle | |
| 6,781,173 B1 * | 8/2004 | Tuttle et al. | 257/295 |
| 2002/0030489 A1 * | 3/2002 | Lenssen et al. | 324/252 |
| 2002/0048127 A1 * | 4/2002 | Fukuzawa et al. | 360/324.1 |

* cited by examiner

Primary Examiner—David Nelms
Assistant Examiner—Thinh T Nguyen
(74) Attorney, Agent, or Firm—Tung & Associates

(57) ABSTRACT

A magnetoresistive magnetic data storage product and a method for fabrication thereof both employ a magnetic data storage device formed over a substrate. The magnetic data storage device comprises a free magnetoresistive material layer separated from a pinned magnetoresistive material layer by a dielectric spacer material layer, each having a sidewall. The magnetic data storage product also comprises a sidewall spacer material layer formed annularly surrounding and covering the sidewall of at least one of the free magnetoresistive material layer and the pinned magnetoresistive material layer. The magnetic data storage product is fabricated with enhanced magnetic data storage density.

16 Claims, 3 Drawing Sheets

MAGNETORESISTIVE (MR) MAGNETIC DATA STORAGE DEVICE WITH SIDEWALL SPACER LAYER ISOLATION

BACKGROUND OF THE INVENTION

1. Field of the Invention

The present invention relates generally to magnetoresistive (MR) magnetic data storage products. More particularly, the present invention relates to magnetoresistive magnetic data storage products with enhanced magnetic data storage density.

2. Description of the Related Art

Magnetoresistive magnetic data storage products and magnetoresistive magnetic data storage devices employ magnetoresistive materials for purposes of digital magnetic data storage. Magnetoresistive magnetic data storage devices typically include, but are not necessarily limited to spin tunneling devices which employ at minimum a free magnetoresistive material layer separated from a pinned magnetoresistive material layer by a dielectric spacer material layer. Spin tunneling devices may be magnetically programmed to provide non-volatile digital magnetic data storage incident to parallel or anti-parallel alignment of magnetic vectors within a free magnetoresistive material layer with respect to a pinned magnetoresistive material layer.

Magnetoresistive magnetic data storage products and devices are desirable in the digital data storage art insofar as magnetoresistive magnetic data storage products and devices are often readily monolithically integrated with semiconductor products and semiconductor devices.

While magnetoresistive magnetic data storage products and devices are thus clearly desirable, they are nonetheless not entirely without problems.

In that regard, magnetoresistive magnetic data storage products and devices are often difficult to fabricate with enhanced magnetic data storage density.

It is thus towards the foregoing object that the present invention is directed.

Various magnetoresistive magnetic data storage products and devices having desirable properties have been disclosed in the magnetoresistive magnetic data storage art.

Included but not limiting among the magnetoresistive magnetic data storage products and devices are those disclosed within: (1) Shi et al., in U.S. Pat. No. 5,959,880 (a magnetoresistive tunneling junction magnetoresistive magnetic data storage device which employs three magnetoresistive material layers); (2) Sandhu et al., in U.S. Pat. No. 6,358,756 (a magnetoresistive magnetic data storage device having a lower magnetoresistive material layer formed within a trench and an upper magnetoresistive material layer formed thereover and within an aperture defined by a pair of spacer layers); and (3) Tuttle, in U.S. Pat. No. 6,413,788 (a magnetoresistive magnetic data storage device which employs magnetic keeper layers).

The teachings of each of the foregoing references are incorporated herein fully by reference.

Desirable in the magnetoresistive magnetic data storage art are magnetoresistive magnetic data storage products and devices with enhanced magnetic data storage density.

It is towards the foregoing object that the present invention is directed.

SUMMARY OF THE INVENTION

A first object of the invention is to provide a magnetoresistive magnetic data storage product.

A second object of the invention is to provide a magnetoresistive magnetic data storage product in accord with the first object of the invention, wherein the magnetoresistive magnetic data storage product is fabricated with enhanced magnetic data storage density.

In accord with the objects of the invention, the invention provides a magnetoresistive magnetic data storage product and a method for fabricating the magnetoresistive magnetic data storage product.

In accord with the invention, the magnetoresistive magnetic data storage product comprises a substrate. The magnetoresistive magnetic data storage product also comprises a magnetic data storage device formed over the substrate. The magnetic data storage device comprises a free magnetoresistive material layer separated from a pinned magnetoresistive material layer by a dielectric spacer material layer, where each of the free magnetoresistive material layer, the pinned magnetoresistive material layer and the dielectric spacer material layer has a sidewall. Finally, the magnetoresistive magnetic data storage product also comprises a sidewall spacer material layer annularly surrounding the sidewall of at least one of the free magnetoresistive material layer and the pinned magnetoresistive material layer.

The magnetoresistive magnetic data storage product of the invention contemplates a method for fabricating the magnetoresistive magnetic data storage product.

The present invention provides a magnetoresistive magnetic data storage product, wherein the magnetoresistive magnetic data storage product is fabricated with enhanced magnetic data storage density.

The invention realizes the foregoing object by forming a sidewall spacer material layer annularly surrounding and covering a sidewall of at least one of a free magnetoresistive material layer and a pinned magnetoresistive material layer which are separated by a dielectric spacer material layer within the magnetoresistive magnetic data storage product. Within the invention, the sidewall spacer material layer provides isolation and etch stop properties such that conductor interconnect layers may be formed with enhanced density within the magnetoresistive magnetic data storage product and thus the magnetoresistive magnetic data storage product may be fabricated with enhanced magnetic data storage density.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a magnetoresistive magnetic data storage product, wherein the magnetoresistive magnetic data storage product is fabricated with enhanced magnetic data storage density.

The invention realizes the foregoing object by forming a sidewall spacer material layer annularly surrounding and covering a sidewall of at least one of a free magnetoresistive material layer and a pinned magnetoresistive material layer which are separated by a dielectric spacer material layer within the magnetoresistive magnetic data storage product. Within the invention, the sidewall spacer material layer provides isolation and etch stop properties such that conductor interconnect layers may be formed with enhanced density within the magnetoresistive magnetic data storage product and thus the magnetoresistive magnetic data storage product may be fabricated with enhanced magnetic data storage density.

FIG. 1 to FIG. 9 show a series of schematic cross-sectional, plan-view and isometric-view diagrams illustrating the results of progressive stages of fabricating a series of magnetoresistive magnetic data storage products in accord with the preferred embodiments of the invention.

Figure 1:
FIG. 1, FIG. 2, FIG. 3, FIG. 4, FIG. 5, FIG. 6, FIG. 7, FIG. 8 and FIG. 9 show a series of schematic cross-sectional, plan-view and isometric-view diagrams illustrating the results of progressive stages of fabricating a series of magnetoresistive magnetic data storage products in accord with the preferred embodiments of the invention.

FIG. 1 shows a schematic cross-sectional diagram of a magnetoresistive magnetic data storage product at an early stage in its fabrication in accord with the invention.

FIG. 1 shows a substrate 10 having formed therein a patterned conductor layer 12.

Within the invention, the substrate 10 typically incorporates a series of dielectric layers and conductor layers which include the patterned conductor layer 12. However, within the invention, the substrate 10 is not in particular limited to having either a patterned conductor layer surface or a dielectric layer surface. In addition, although not specifically illustrated within the schematic cross-sectional diagram of FIG. 1, and in particular when the substrate 10 comprises a semiconductor substrate as employed within a semiconductor product, the substrate 10 will typically have formed therein microelectronic devices as are conventional within the microelectronic product within which is employed the substrate 10. Such microelectronic devices may include, but are not limited to, resistors, transistors, diodes and capacitors. Most typically and preferably, the substrate 10 comprises a semiconductor substrate having formed therein a series of microelectronic devices such as transistor switching devices which are intended to access and actuate a magnetoresistive magnetic data storage device within a magnetoresistive magnetic data storage product in accord with the present invention.

Within the invention, the patterned conductor layer 12 may be formed of conductor materials as are otherwise generally conventional in the microelectronic fabrication art, including but not limited to metal and metal alloy conductor materials.

Figure 2:
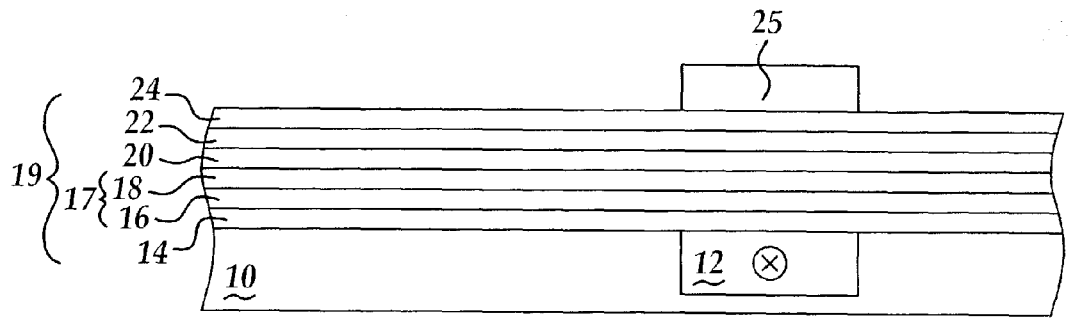

FIG. 2 illustrates the results of further processing of the magnetoresistive magnetic data storage product of FIG. 1.

FIG. 2 shows a series of six blanket layers formed upon the substrate 10 including the patterned conductor layer 12.

Within the invention, the series of six blanket layers includes: (1) a blanket first conductor spacer material layer 14 formed upon exposed portions of the substrate 10; (2) a blanket pinning material layer 16 (which is typically formed of an anti-ferromagnetic material (AFM) and may alternatively be referred to as a blanket AFM layer 16) formed upon the blanket first conductor spacer material layer 14; (3) a blanket first magnetoresistive material layer 18 (which is pinned by the blanket AFM layer) formed upon the blanket pinning material layer 16; (4) a blanket dielectric spacer material layer 20 formed upon the blanket first magnetoresistive material layer 18; (5) a blanket second magnetoresistive material layer 22 (which may alternatively be referred to as a blanket free magnetoresistive material layer 22) formed upon the blanket dielectric spacer material layer 20; and (6) a blanket second conductor spacer material layer 24 formed upon the blanket second (or free) magnetoresistive material layer 22. Within FIG. 2, the blanket pinning material layer 16 and the blanket first magnetoresistive material layer 18 in an aggregate form a blanket pinned magnetoresistive material layer 17. The foregoing series of six blanket layers provides a blanket magnetoresistive stack layer 19.

Figure 3:
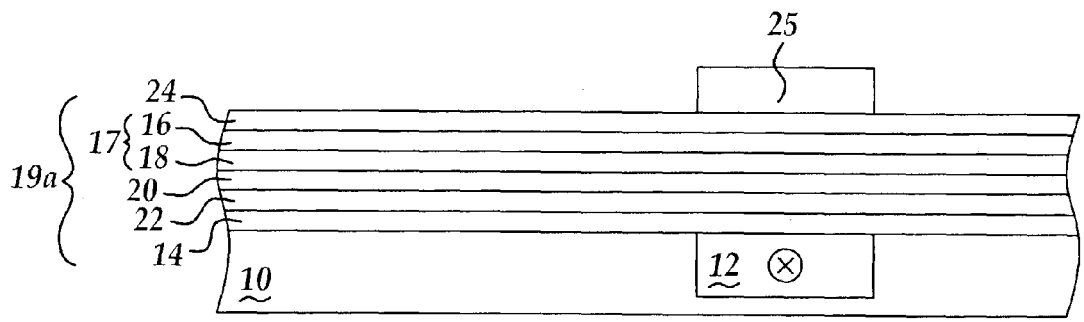

Within the invention (including all embodiments as subsequently described), the positions of the blanket pinned magnetoresistive material layer 17 and the blanket free magnetoresistive material layer 22 may alternatively be switched with respect to the remaining blanket layers as illustrated in FIG. 2, provided that each of the blanket first magnetoresistive material layer 18 and the blanket second magnetoresistive material layer 22 are separated by and contact the blanket dielectric spacer material layer 20. Such a switching provides the magnetoresistive magnetic data storage product as illustrated in FIG. 3, having formed therein a blanket magnetoresistive stack layer 19a rather than the blanket magnetoresistive stack layer 19 as illustrated in FIG. 2.

Within the invention, each of the blanket first conductor spacer material layer 14 and the blanket second conductor spacer material layer 24 is optional and each is formed of a conductor spacer material such as but not limited to an aluminum, aluminum alloy, copper or copper alloy conductor spacer material. Typically, each of the blanket first conductor spacer material layer 14 and the blanket second conductor spacer material layer 24 is formed to a thickness of from about 500 to about 1000 angstroms such as to provide an additional height to the blanket magnetoresistive stack layer 19 or 19a.

Within the invention, the blanket pinning material layer 16 is typically formed of a hard magnetic material, such as an antiferromagnetic hard magnetic material, further such as a {50:50 w:w iron-manganese alloy, formed to a thickness of from about 200 to about 500 angstroms. Other pinning materials, and in particular other antiferromagnetic hard magnetic materials, may also be employed for forming the blanket pinning material layer 16.

Within the invention, each of the blanket first magnetoresistive material layer 18 (i.e., from which is comprised the blanket pinned magnetoresistive material layer 17) and the blanket second magnetoresistive material layer 22 (i.e., alternatively the blanket free magnetoresistive material layer 22) may be formed of a magnetoresistive material as is conventional or unconventional in the magnetoresistive magnetic data storage art. Such magnetoresistive materials may include, but are not limited to nickel, nickel alloys, cobalt, cobalt alloys, iron and iron alloys. Most typically, each of the blanket first magnetoresistive material layer 18 and the blanket second magnetoresistive material layer 22 is formed of a Permalloy (i.e., iron-cobalt 80:20 w:w alloy) magnetoresistive material formed to a thickness of from about 10 to about 200 angstroms.

Within the invention, the blanket dielectric spacer material layer 20 is formed of a dielectric spacer material such as to eventually provide a spin tunneling magnetoresistive magnetic data storage device. Preferably, the blanket dielectric spacer material layer 20 comprises a silicon oxide or aluminum oxide spacer material formed to a thickness of from about 5 to about 20 angstroms.

Finally, each of FIG. 2 and FIG. 3 show a patterned photoresist layer 25 formed upon the blanket second conductor spacer material layer 24.

Within the invention, the patterned photoresist layer 25 may be formed employing methods and materials as are conventional in the microelectronic product fabrication art.

While the magnetoresistive magnetic data storage product of either FIG. 2 or FIG. 3 may be further processed to provide a magnetoresistive magnetic data storage product in accord with the invention, for efficiency, further processing of only the magnetoresistive magnetic data storage product of FIG. 2 will be illustrated in the description which follows. Thus, FIG. 4 shows the results of further processing of the magnetoresistive magnetic data storage product of FIG. 2.

Figure 4:
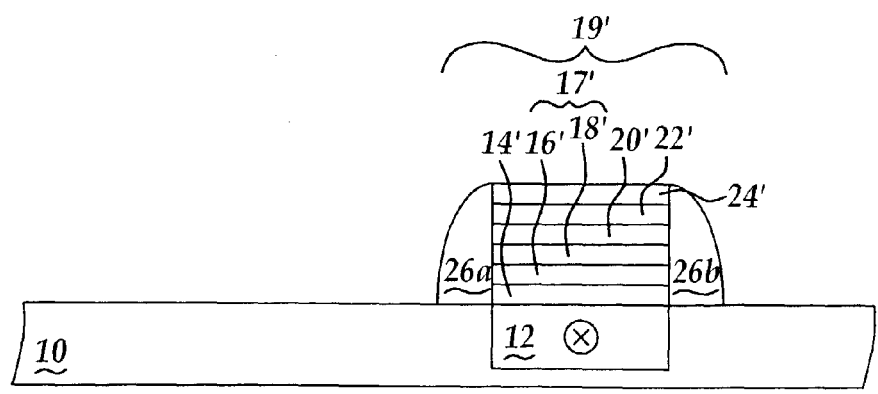

FIG. 4 shows the results of successively etching the blanket second conductor spacer material layer 24, the blanket second magnetoresistive material layer 22, the blanket dielectric spacer material layer 20, the blanket first magnetoresistive material layer 18, the blanket pinning material layer 16 and the blanket first conductor spacer material layer 14 to form a corresponding patterned second conductor spacer material layer 24', patterned second magnetoresistive material layer 22', patterned dielectric spacer material layer 20', patterned first magnetoresistive material layer 18', patterned pinning material layer 16' and patterned first conductor spacer material layer 14', while employing the patterned photoresist layer 25 as an etch mask layer, in conjunction with an etching plasma which is not otherwise illustrated. As is illustrated in FIG. 4, the patterned second magnetoresistive material layer 18' and the patterned pinning material layer 16' form a patterned pinned magnetoresistive material layer 17'. The foregoing six patterned layers in an aggregate form a patterned magnetoresistive stack layer 19' having a series of nominally coplanar sidewalls of the series of patterned layers.

Within the invention, the etching plasma typically employs a sequence of etchant gases as is appropriate for the materials from which are formed the blanket second conductor spacer material layer 24, the blanket second magnetoresistive material layer 22, the blanket dielectric spacer material layer 20, the blanket first magnetoresistive material layer 18, the blanket pinning material layer 16 and the blanket first conductor spacer material layer 14. Subsequent to the sequential etching as described above, the patterned photoresist layer 25 as illustrated in FIG. 2 is stripped to provide in part the magnetoresistive magnetic data storage product as illustrated in FIG. 4.

Finally, FIG. 4 shows a pair of anisotropically etched sidewall spacer material layers 26a and 26b (which are intended as representative of a single annular sidewall spacer material layer in accord with additional disclosure below) formed adjoining a pair of opposite sidewalls of the patterned magnetoresistive stack layer 19'. Within the invention, the pair of sidewalls of the patterned magnetoresistive stack layer 19' derives from an aggregate of the corresponding sidewalls of the series of patterned layers which comprise the patterned magnetoresistive stack layer 19'. As is illustrated within FIG. 4, the pair of anisotropically etched sidewall spacer material layers 26a and 26b completely covers and laterally extends from the pair of opposite sidewalls of the patterned magnetoresistive stack layer 19'. Such complete coverage includes coverage of the sidewalls of the patterned pinned magnetoresistive material layer 17', the patterned dielectric spacer material layer 20' and the patterned free magnetoresistive material layer 22'.

Within the invention, the pair of anisotropically etched sidewall spacer material layers 26a and 26b is formed employing methods as are conventional in the art. Typically, the pair of anisotropically etched sidewall spacer material layers 26a and 26b is formed of a silicon nitride material such as to provide etch stop properties with respect to overlying layers to be further formed thereupon or thereover, as disclosed in greater detail below.

Figure 5:
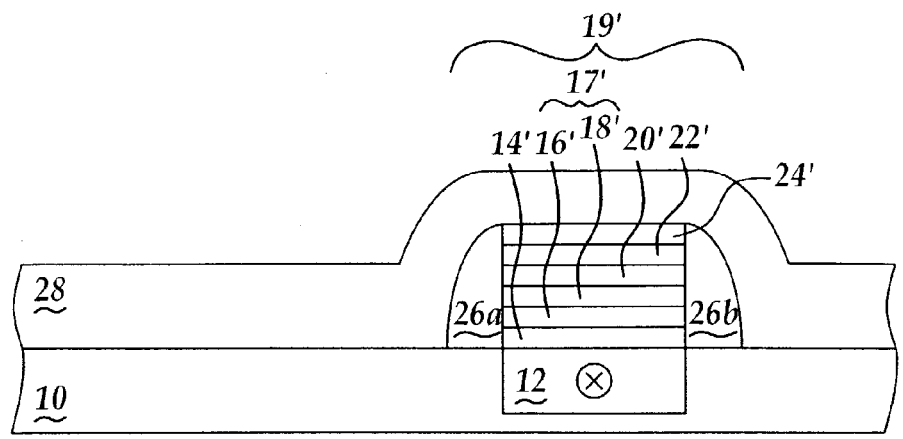

FIG. 5 illustrates the results of further processing of the magnetoresistive magnetic data storage product of FIG. 4 to provide a magnetoresistive magnetic data storage product in accord with a first embodiment of the invention.

FIG. 5 illustrates a patterned conductor interconnect layer 28 formed bridging to the patterned second conductor spacer material layer 24'. Within the invention, the patterned conductor interconnect layer 28 may be formed of conductor materials as are conventional in the microelectronic product fabrication art. Typically the patterned conductor interconnect layer 28 is formed to a thickness of from about 4000 to about 7000 angstroms.

As is illustrated within the schematic cross-sectional diagram of FIG. 5, the patterned conductor interconnect layer 28 is formed upon the anisotropically etched sidewall spacer material layers 26a and 26b such that contact to the patterned second conductor spacer material layer 24' may be made while not forming a shorting electrical path to other conductor layers or magnetoresistive material layers within the patterned magnetoresistive stack layer 19'.

Figure 6:
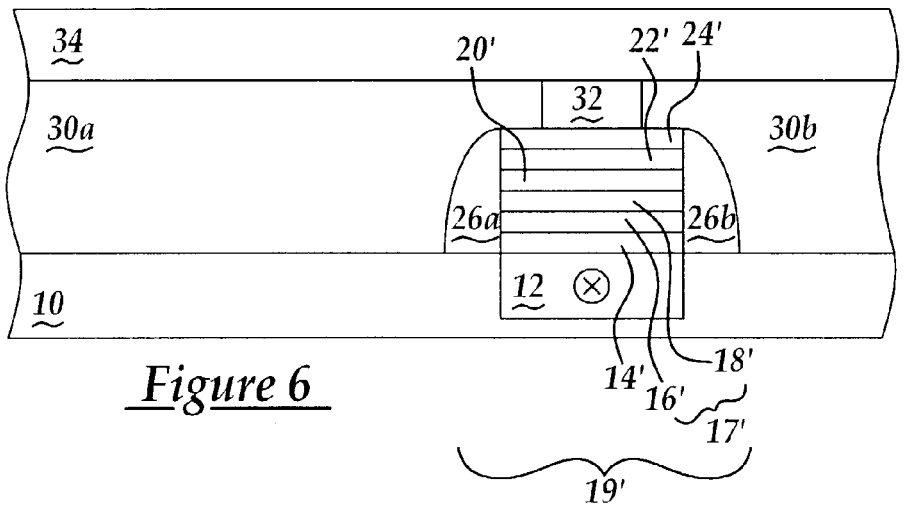

FIG. 6 shows a schematic cross-sectional diagram illustrating the results of an alternative further processing of the magnetoresistive magnetic data storage product of FIG. 4 to provide a magnetoresistive magnetic data storage product in accord with a second embodiment of the invention.

FIG. 6 illustrates a pair of patterned inter-metal dielectric (IMD) layers 30a and 30b formed upon exposed portions of the substrate 10, the anisotropically etched sidewall spacer material layers 26a and 26b and the patterned second conductor spacer material layer 24', such as to provide a via accessing the patterned second conductor spacer material layer 24'.

Within the invention, the pair of patterned inter-metal dielectric layers 30a and 30b is preferably formed of a dielectric material with respect to which the pair of anisotropically etched sidewall spacer material layers 26a and 26b serves as an etch stop. Typically each of the pair of patterned inter-metal dielectric layers 30a and 30b is formed of a silicon oxide material formed to a thickness of from about 10000 to about 20000 angstroms.

Also shown within FIG. 6 is a conductor stud layer 32 formed into the via, where the conductor stud layer 32 contacts the patterned second conductor spacer material layer 24'.

Within the invention, the conductor stud layer 32 is typically formed of a conductor material as is conventional in the microelectronic product fabrication art, such as tungsten, tungsten alloy, copper, copper alloy, aluminum and aluminum alloy conductor materials.

Finally, FIG. 6 also illustrates a patterned interconnect layer 34 contacting the conductor stud layer 32.

Within the second embodiment of the invention, the patterned conductor interconnect layer 34 may be formed employing methods and materials analogous or equivalent to the methods and materials employed for forming the patterned conductor interconnect layer 28 as illustrated within FIG. 5.

As is understood by a person skilled in the art, the pair of anisotropically etched sidewall spacer material layers 26a and 26b within FIG. 6 provide additional process latitude as etch stop layers when forming the via into which is formed the conductor stud layer 32, such as to also avoid shorting between various conductor layers and magnetoresistive material layers within the patterned magnetoresistive stack layer 19'.

Thus, within either the first embodiment of the invention or the second embodiment of the invention, the use of the anisotropically etched sidewall spacer material layers 26/26a/26b provides for attenuated shorting between patterned conductor layers and/or patterned magnetoresistive material layers within a magnetoresistive magnetic data storage product. Since the anisotropically etched sidewall spacer material layers 26/26a/26b are formed in a self aligned fashion, they realize the foregoing object while avoiding a need for additional masking layers when forming a magnetoresistive magnetic data storage product. Thus, the magnetoresistive magnetic data storage product may be formed with enhanced magnetic data storage density.

Figure 7:
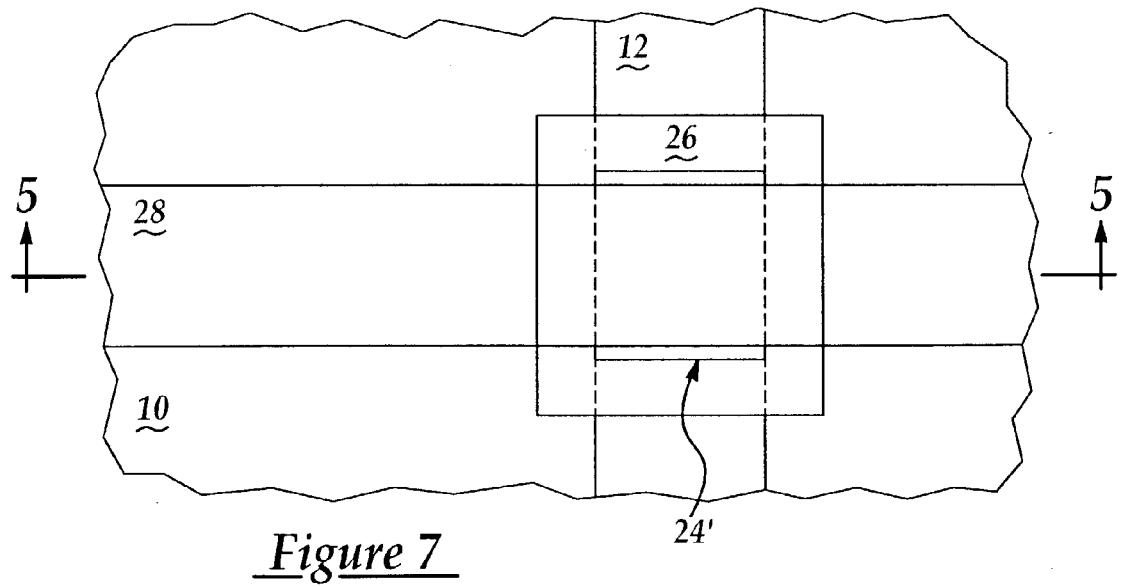

For reference purposes, FIG. 7 illustrates a schematic plan-view diagram of the magnetoresistive magnetic data storage product of FIG. 5.

FIG. 7 illustrates the substrate 10 having formed therein the patterned conductor layer 12 which has formed in part thereupon the patterned magnetoresistive stack layer 19' which terminates in the patterned second conductor spacer material layer 24'. The patterned magnetoresistive stack layer 19' is in turn annularly surrounded by the anisotropically etched sidewall spacer material layer 26. The substrate 10, the anisotropically etched sidewall spacer material layer 26 and the patterned second conductor spacer material layer 24' have formed thereupon the patterned conductor interconnect layer 28.

Figure 8:
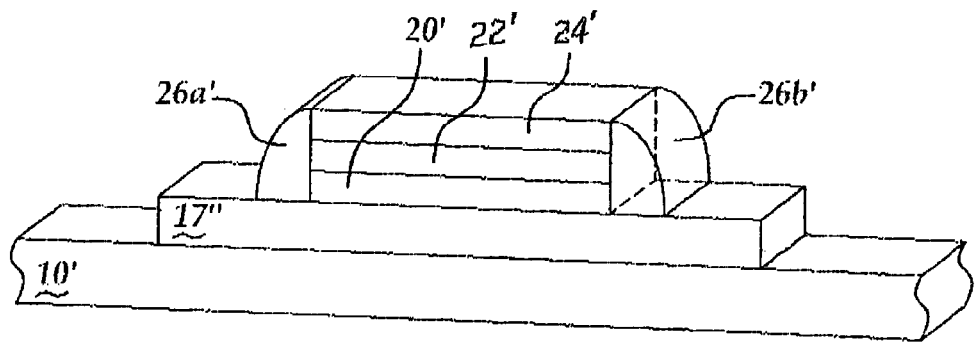
Figure 9:
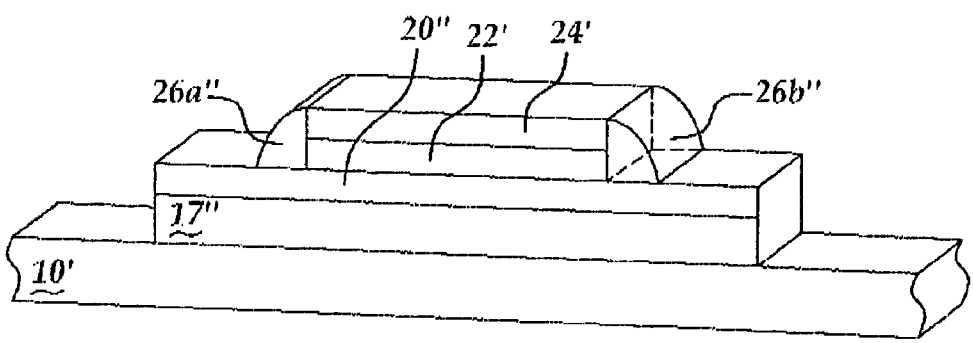

Illustrated in FIG. 8 and FIG. 9 is a pair of schematic isometric-view diagrams of a pair of magnetoresistive magnetic data storage products in accord with an additional pair of embodiments of the invention.

The schematic isometric-view diagrams of FIG. 8 and FIG. 9 derive from the schematic cross-sectional diagram of FIG. 4, but with the absence of: (1) the patterned conductor layer 12 within the substrate 10 (i.e., to provide a substrate 10' within FIG. 8 and FIG. 9); and (2) the patterned first conductor spacer material layer 14' formed contacting the patterned conductor layer 12.

Within FIG. 8, a patterned pinned magnetoresistive material layer 17" is formed with a greater linewidth in comparison with the patterned dielectric spacer material layer 20', the patterned free magnetoresistive material layer 22' and the patterned second conductor spacer material layer 24', which are otherwise areally co-extensive and have annularly surrounding a series of sidewalls thereof a pair of attenuated isotropically etched sidewall spacer material layer 26a' and 26b'.

The magnetoresistive magnetic data storage product of FIG. 9 differs from the magnetoresistive magnetic data storage product of FIG. 8 insofar as: (1) both the patterned pinned magnetoresistive material layer 17" and a patterned dielectric spacer material layer 20" are formed of a greater areal linewidth than the patterned free magnetoresistive material layer 22' and the patterned second conductor spacer material layer 24'; and (2) a pair of further attenuated sidewall spacer material layers 26a" and 26b" is formed passivating the sidewalls of only the patterned second conductor spacer material layer 24' and the patterned free magnetoresistive material layer 22'.

The magnetoresistive magnetic data storage products of FIG. 8 and FIG. 9 are fabricated analogously with the magnetoresistive magnetic data storage product of FIG. 4, but the blanket magnetoresistive stack layer 19 (minus the blanket first conductor spacer material layer 14) is incompletely etched with either the blanket dielectric spacer material layer 20 or the blanket pinned magnetoresistive material layer 17" serving as an etch stop layer. The pair of attenuated sidewall spacer material layers 26a' and 26b' or the pair of further attenuated sidewall spacer material layers 26a" and 26b" (either pair as representative of a corresponding annular sidewall spacer material layer) may then be formed employing an anisotropic etching method. Finally, as appropriate, the blanket pinned magnetoresistive material layer 17 and the blanket dielectric spacer material layer 20 may be patterned employing a second photolithographic method to form the patterned pinned magnetoresistive material layer 17" and the patterned dielectric spacer material layer 20".

The magnetoresistive magnetic data storage products of FIG. 8 and FIG. 9 are particularly useful under circumstances where it is desirable to have only frontside contacts to a magnetoresistive magnetic data storage device within a magnetoresistive magnetic data storage product. In addition, the magnetoresistive magnetic data storage products of FIG. 8 and FIG. 9 may employ the patterned pinned magnetoresistive material layer 17" (or in an inverted configuration an analogous patterned free magnetoresistive material layer) as a patterned conductor layer (in place of the patterned conductor layer 12 as illustrated in FIG. 4).

As is illustrated in FIG. 4, FIG. 8 and FIG. 9, the invention provides a magnetoresistive magnetic data storage product comprising a pinned magnetoresistive material layer separated from a free magnetoresistive material layer by a dielectric spacer layer, each having a sidewall, and wherein the sidewall of at least one of the pinned magnetoresistive material layer and the free magnetoresistive material layer is annularly surrounded and passivated with a sidewall passivation dielectric layer. The sidewall passivation dielectric layer provides for enhanced areal density when forming an array of magnetic data storage devices within the magnetic data storage product.

The preferred embodiments of the invention are illustrative of the invention rather than limiting of the invention. Revisions and modifications may be made to methods, materials, structures and dimensions in accord with the preferred embodiments of the invention while still providing a magnetoresistive magnetic data storage product in accord with the invention, and a method for fabrication thereof, further in accord with the accompanying claims.

What is claimed is:

1. A tunneling magnetoresistive magnetic data storage product with improved electrical isolation and storage density comprising:
a substrate;
a magnetic data storage device formed over the substrate, the magnetic data storage device comprising a free magnetoresistive material layer separated from a pinned magnetoresistive material layer by a dielectric spacer material layer, the pinned magnetoresistive material layer comprising a magnetoresistive material layer and an adjacent anti-ferromagnetic layer, the magnetic data storage device comprising at least a first stack of layers overlying the substrate;
wherein a single self aligned sidewall spacer is disposed annularly surrounding the sidewalls of the first stack of layers, the first stack of layers further comprising an uppermost conductive layer for carrying a current and layers underlying the uppermost conductive layer selected from the group consisting of:

the free magnetoresistive material layer, and the pinned magnetoresistive material layer, and the dielectric spacer material layer; and, wherein underlying layers not selected from the group to form the first stack of layers, if any, comprise a second stack of layers, the second stack of layers disposed underlying the first stack of layers, the second stack of layers having exposed sidewalls, and the second stack of layers having a larger width than the first stack of layers.

2. The magnetoresistive magnetic data storage product of claim 1 wherein the thereto anti-ferromagnetic material layer is disposed contacting the dielectric spacer material layer.

3. The magnetoresistive magnetic data storage product of claim 1 wherein the dielectric spacer material layer is formed to a thickness of from about 5 to about 20 angstroms.

4. The magnetoresistive magnetic data storage product of claim 1 wherein the first stack of layers further comprises a conductor spacer layer interposed between the substrate and the magnetic data storage device.

5. The magnetoresistive magnetic data storage product of claim 1 wherein the sidewall of first stack of layers consists essentially of the uppermost conductive layer, one of the pinned magnetoresistive material layer and the free magnetoresistive material layer, and the dielectric spacer material layer.

6. The magnetoresistive magnetic data storage product of claim 1 wherein the first stack of layers consists essentially of the uppermost conductive layer, the pinned magnetoresistive material layer, the dielectric spacer material layer, and the free magnetoresistive material layer, and a conductor spacer layer interposed between the substrate and the magnetic data storage device.

7. The magnetoresistive magnetic data storage product of claim 1 wherein the first stack of layers comprises the uppermost conductive layer, the free magnetoresistive material layer, and the dielectric spacer material layer.

8. The magnetoresistive magnetic data storage product of claim 7, wherein the second stack of layers comprises the pinned magnetoresistive layer.

9. The magnetoresistive magnetic data storage product of claim 1 wherein the first stack of layers comprises the uppermost conductive layer and the free magnetoresistive material layer.

10. The magnetoresistive magnetic data storage product of claim 9, wherein the second stack of layers comprises the dielectric spacer material layer and the pinned magnetoresistive layer.

11. The magnetoresistive magnetic data storage product of claim 1 wherein the first stack of layers comprises the uppermost conductive layer, the pinned magnetoresistive material layer, and the dielectric spacer material layer.

12. The magnetoresistive magnetic data storage product of claim 11, wherein the second stack of layers comprises the free magnetoresistive layer.

13. The magnetoresistive magnetic data storage product of claim 1 wherein the first stack of layers comprises the uppermost conductive layer and the pinned magnetoresistive material layer.

14. The magnetoresistive magnetic data storage product of claim 13, wherein the second stack of layers comprises the dielectric spacer material layer and the free magnetoresistive layer.

15. The magnetoresistive magnetic data storage product of claim 1, further comprising a patterned conductor interconnect layer disposed over the magnetic data storage device to contact the uppermost conductor layer.

16. The magnetoresistive magnetic data storage product of claim 1, further comprising an inter-metal dielectric (IMD) layer disposed over the magnetic data storage device, the IMD layer comprising a conductor via to contact the uppermost conductor layer.

* * * * *